United States Patent
Seabaugh et al.

[11] Patent Number: 6,139,483
[45] Date of Patent: Oct. 31, 2000

[54] METHOD OF FORMING LATERAL RESONANT TUNNELING DEVICES

[75] Inventors: Alan C. Seabaugh, Richardson; Yung Chung Kao, Dallas; Andrew J. Purdes, Garland; John N. Randall, Richardson, all of Tex.

[73] Assignee: Texas Instruments Incorporated, Dallas, Tex.

[21] Appl. No.: 08/097,526

[22] Filed: Jul. 27, 1993

[51] Int. Cl.[7] .................................................. H01L 21/20
[52] U.S. Cl. .......................... 498/503; 438/481; 438/595; 438/962
[58] Field of Search ..................................... 437/107, 110, 437/133, 962; 148/DIG. 160, DIG. 106; 438/481, 503, 595, 962

[56] References Cited

U.S. PATENT DOCUMENTS

| | | | |
|---|---|---|---|
| 4,209,349 | 6/1980 | Ho et al. | 148/187 |
| 4,256,514 | 3/1981 | Pogge | 148/1.5 |
| 4,358,340 | 11/1982 | Fu | 156/643 |
| 4,424,621 | 1/1984 | Abbas et al. | 29/571 |
| 4,502,914 | 3/1985 | Trumpp et al. | 156/643 |
| 4,592,792 | 6/1986 | Corboy, Jr. et al. | 156/612 |
| 4,650,544 | 3/1987 | Erb et al. | 156/653 |
| 4,803,181 | 2/1989 | Buchmann et al. | 437/228 |
| 4,883,769 | 11/1989 | Au Coin et al. | 437/110 |
| 4,948,751 | 8/1990 | Okamoto et al. | 437/107 |
| 4,983,540 | 1/1991 | Yamaguchi et al. | 437/110 |
| 5,055,383 | 10/1991 | Koblinger et al. | 430/312 |
| 5,234,848 | 8/1993 | Seabaugh | 437/40 |

FOREIGN PATENT DOCUMENTS

| | | | |
|---|---|---|---|
| 144732 | 6/1993 | Japan | 437/110 |

OTHER PUBLICATIONS

C. Johnson et al., "Method for Making Submicron Dimensions in Structures Using Sidewall Image Transfer Techniques" IBM Technical Disclosure Bulletin vol. 26, No. 9 Feb. 1984 pp. 4587–4589.

J.N. Randall et al. "Electric Field Coupling to Quantum Dot Diodes" J. Vac. Sci. Technolo B9(6) Nov./Dec. 1991 pp. 2893–2897.

Luscombe, "Current issues in nanoelectronic modelling", Nanotechnology, vol. 4, 1993, pp. 1–20.

Randall, "A lateral–resonant–tunneling universal quantum–dot cell", Nanotechnology, vol. 4, 1993, pp. 41–48.

Abbas, et al., "Extending the Minimal Dimensions of Photolithographic Integrated–Circuit Fabrication Processing", IBM Technical Disclosure Bulletin, vol. 20, No. 4, Sep. 1977, pp. 1376–1378.

Galeuchet, et al., "In situ buried GaInAs/Inp quantum dot arrays by selective area metalorganic vapor phase epitaxy", Appl. Phys. Lett., 58(21), May 27, 1991, pp. 2423–2425.

*Primary Examiner*—Charles Bowers
*Assistant Examiner*—Keith Christianson
*Attorney, Agent, or Firm*—Carlton H. Hoel; W. James Brady; Frederick J. Telecky, Jr.

[57] ABSTRACT

A method of fabricating a quantum well device is presented which includes forming one or more quantum wells 48 by forming an epitaxy mask followed by selective deposition of one or more epitaxial layers. Selective deposition is accomplished by forming an epitaxy mask by sidewall defined masking, followed by epitaxial deposition of one or more layers (e.g. barrier layers 40 and 44 and a quantum layer 42) The epitaxy mask is formed by patterning an e-beam resist layer (e.g. polymethylmethacrylate 36), conformally depositing a glass layer (e.g. $SiO_2$ 38) on the resist, anisotropically etching the $SiO_2$, and then removing the e-beam resist layer. The epitaxy mask fabrication technique allows patterning to define geometries that are much smaller than the beam itself and thereby provides the means required to define nanometer dimensioned horizontal (lateral) structures on and within epitaxial layers.

5 Claims, 3 Drawing Sheets

METHOD OF FORMING LATERAL RESONANT TUNNELING DEVICES

CROSS-REFERENCE TO RELATED APPLICATIONS

| Title | First Named Inventor | Docket/Serial # |
|---|---|---|
| Universal Quantum Dot Logic Cell | Randall | TI-16553/07/811,557 |
| A Method for Fabricating Lateral Resonant Tunneling Transistor with Heterojunction Barriers | Seabaugh | TI-16240/07/787,850 |
| Output Isolation for Quantum Well Devices | Luscombe | TI-17414 |
| Lateral resonant Tunneling Transistor with Heterojunction Barriers | Seabaugh | TI-16240.1/08/048,870 |

FIELD OF THE INVENTION

This invention generally relates to integrated circuit fabrication techniques and more specifically to techniques which allow the formation of ultra-small structures for use in nanoelectronic devices.

BACKGROUND OF THE INVENTION

Without limiting the scope of the invention, its background is described in connection with coupled quantum well logic devices, as an example.

Integrated circuits have become the technology of choice for performing logic functions. The downscaling of minimum device geometries has provided for increases in the functional density and performance of integrated circuits. The development of nanoelectronic devices has allowed for the continuing increase in functional density of integrated electronic systems beyond the currently perceived limits for conventional electron devices. The term "nanoelectronics" refers to an integrated circuit technology that permits downscaling of minimum circuit geometries to the order of 0.01 microns, or 10 nanometers (nm).

In electronic devices having nanometer dimensions, the behavior of electrons can best be understood by considering their wave-like properties. Two important electron quantum phenomena that can be observed are "tunneling", whereby electrons pass through potential energy barriers, and "resonance", whereby steady state tunneling current is substantially reinforced because of the dimensions of quantized regions through which electrons tunnel. Tunneling and resonance are observed when allowed energy states between adjacent quantum well regions are aligned.

When electrons are confined by potential barriers to regions approaching the size of the electron in all three spatial dimensions, the spectrum of allowed energy states for the electron is discretized and the region is called a quantum dot. Similarly, when the electron is confined in two spatial dimensions, the allowed energy spectrum is also modified and the region is called a quantum wire. When electrons are confined by potential barriers in only one spatial dimension, the region is referred to as a quantum well. The term quantized region, as used herein, is a general term that refers to any of those structures.

Physically, quantum dots can be as simple as nanometer-sized cubes or rods of indium gallium arsenide (InGaAs) embedded in a matrix of wider band-gap material such as indium phosphide (InP). The effect of the InP is to create a potential energy barrier for electrons in the InGaAs. These nanometer-sized structures produce sharply defined and well separated allowed electronic energies. An electrical bias can align allowed energy states in potential wells (e.g. quantum dots) which are separated by tunneling barriers, thereby allowing electrons to tunnel through the intermediate barrier material by the process of quantum mechanical resonant tunneling. In this way, the relative electrical isolation or connectivity between quantum dots or wires can be controlled by the electric fields placed on the tunneling barriers. These electric fields serve to either align allowed energy states of adjacent quantum wells (thereby allowing conduction of electrons), or to misalign the allowed energy states so that tunneling does not occur. This control of current through the potential wells by the application of electric potentials can be exploited to build useful electronic devices.

A promising device which makes use of quantum tunneling is the lateral resonant tunneling transistor. In such a device, quantized wells are disposed between non-horizontal physical tunneling barriers such that allowed energy states can be separately modified to enhance or suppress electron tunneling. A method of forming such a device is taught in U.S. patent application Ser. No. 07/787,850, filed Nov. 5, 1991. The method taught involves the epitaxial deposition of continuous films in which trenches are etched to form tunneling barriers.

SUMMARY OF THE INVENTION

When electrons are confined by potential barriers to regions approaching the size of the electron in all three spatial dimensions, the spectrum of allowed energy states for the electron is discretized and the region is called a quantum dot. Similarly, when the electron is confined in two spatial dimensions, the allowed energy spectrum is also modified and the region is called a quantum wire. When electrons are confined by potential barriers in only one spatial dimension, the region is referred to as a quantum well. The term quantized region, as used herein, is a general term that refers to any of those structures. A quantum well device is a device which contains a quantized region. A coupled quantum device is a device in which one or more quantized regions are electrically coupled, generally via resonant tunneling, to other structures or devices, including other quantized regions.

Sidewall defined masking in general is accomplished by conformal deposition of a masking material on a patterned structure with nominally vertical sidewalls, then anisotropic etching of the mask material to remove horizontal portions of the conformal layer, and finally removal of the patterned sidewall structure. This technique produces mask features which can be substantially smaller than the smallest dimension possible in the patterned structure.

Selective epitaxy is a process by which one or more epitaxial layers which have lateral structure are formed without the use of an etch. Selective epitaxy can be caused by facet selective growth or by the tendency of deposited species to avoid the structures which form an epitaxy mask.

Generally, and in one form of the invention, a quantum well device is fabricated by forming an epitaxy mask and then forming one or more quantized regions by selective deposition of one or more epitaxial layers. Preferably, selective deposition is accomplished by forming an epitaxy mask by sidewall defined masking, followed by epitaxial deposition of barrier layers and a quantum layer which serves as the channel of the device. Preferably, the epitaxy mask is formed by patterning an e-beam resist layer, conformally depositing a glass layer such as $SiO_2$ on the resist, anisotropically etching the $SiO_2$, and then removing the e-beam resist layer.

This is apparently the first method of forming quantum devices which makes use of sidewall defined masking and selective epitaxy.

An advantage of the invention is that it is capable of the formation of atomically-flat crystalline facets in sub-20 nm regions for subsequent regrowth of tunnel barriers.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings.

Corresponding numerals and symbols in the different figures refer to corresponding parts unless otherwise indicated.

DETAILED DESCRIPTION OF THE PREFERRED EMBODIMENT

A preferred embodiment of this invention is described with reference to FIGS. 1–14, which are a series of highly magnified schematic cross-sections which illustrate the fabrication sequence of the preferred embodiment. The figures are not necessarily drawn to scale and the relative dimensions of some features of the preferred embodiment structure have been greatly exaggerated for the sake of clarity.

All materials deposited epitaxially in the preferred embodiment of the invention are lattice matched to the substrate. The ratio of indium to aluminum in lattice matched InGaAs, for example, is well known in the art.

Figure 1:
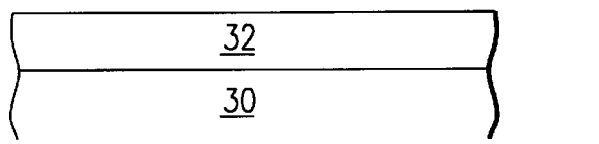
FIG. 1 is a highly magnified schematic cross-sectional view of a substrate with an epitaxially deposited buffer layer.

In FIG. 1, an indium phosphide (InP) substrate of (100) orientation 30 is shown after an pitaxially deposited lower buffer layer 32 has been deposited. Preferably, the lower buffer layer 32 is 30 nm thick lattice matched InAlAs. The lower buffer layer 32 serves to confine electrons within the channel of the device, to be described below.

Figure 2:
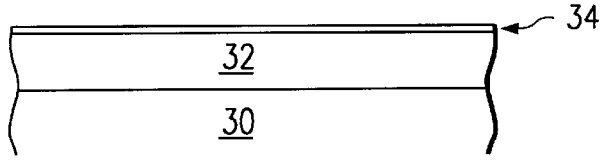
FIG. 2 shows an epitaxially deposited desorption layer on the structure of FIG. 1.
Figure 3:
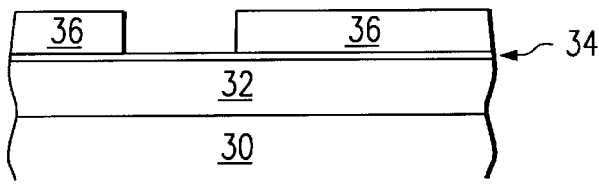
FIG. 3 shows the structure of FIG. 2 with a patterned E-beam resist layer.

FIG. 2 shows the substrate after desorption layer 34 has been epitaxially deposited. Preferably, this desorption layer 34 is 2 nm thick lattice matched InGaAs. This layer serves to prevent the oxidation of the lower buffer layer 32. Generally, these epitaxial deposition steps may be accomplished by any of the many molecular beam epitaxy techniques and systems which are known in the art.

A layer of E-beam resist is deposited on the desorption layer 34. Preferably, the E-beam resist is polymethylmethacrylate (also referred to as PMMA) and is 100 nm thick. The resist is then exposed and developed according to well known methods to produce a patterned E-beam resist layer 36. The patterned resist layer 36 preferably exhibits vertical or near-vertical sidewalls. The relationship between the E-beam resist exposure pattern and the desired structure will become clear as the remaining steps of the preferred embodiment method are given, below.

Figure 4:
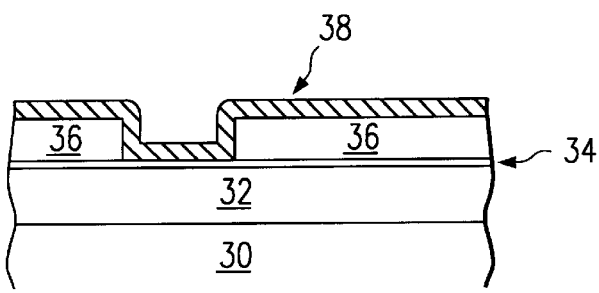
FIG. 4 shows the structure of FIG. 3 after deposition of a thin glass layer.

After E-beam resist development, a thin glass layer 38 is deposited. In the preferred embodiment, this glass layer is 5 nm thick $SiO_2$, with the height of the vertical sidewalls greatly exceeding the thickness. Alternately, $Si_3N_4$ may be used. The deposition parameters are chosen so that the layer is deposited conformally on the patterned E-beam resist layer 36. FIG. 4 shows the substrate after the glass layer 38 is deposited.

Figure 5:
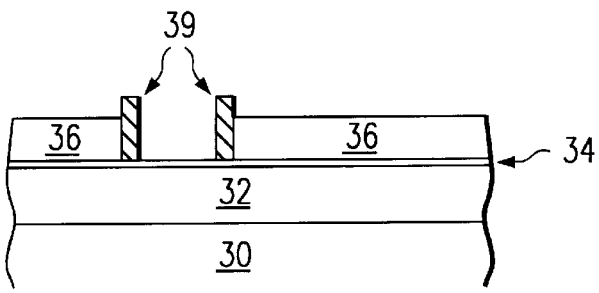
FIG. 5 shows the structure of FIG. 4 after an anisotropic etch has removed horizontal portions of the glass layer.
Figure 6:
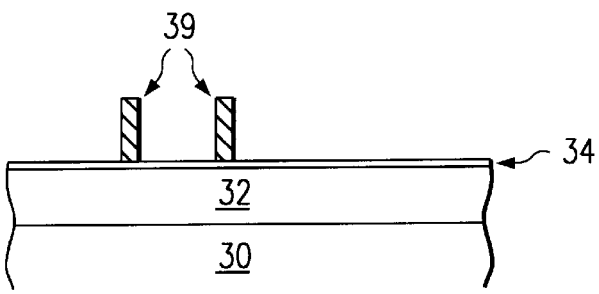
FIG. 6 shows the structure of FIG. 5 after the E-beam resist layer has been removed.

The substrate is then placed in a reactive ion etching chamber where the glass layer 38 is anisotropically etched (i.e. the vertical etch rate is much greater than the horizontal etch rate) to leave only the vertical 'spikes' at the vertical sidewalls of the E-beam resist 36, as shown in FIG. 5. Preferably, the ion etch species are $CF_4/O_2$ (carbon tetrafluoride and oxygen). Other suitable anisotropic reactive ion etches are known in the art. The remaining E-beam resist 36 is then stripped away (preferably using ACETONE leaving only the 'spikes' 39 of the glass layer 38 remaining on the otherwise generally planar surface. These spikes are now referred to as epitaxy masks 39, because they will define the areas of selective epitaxy growth in a future deposition step. As is illustrated in FIG. 5, the resulting epitaxy mask structures 39 have lateral dimensions much smaller than could have been achieved with an E-beam mask. The width of the epitaxy mask 39 is essentially the same as the sidewall thickness of the glass layer 38.

The masking technique described above, and hereinafter referred to as sidewall defined masking, in general is accomplished by (1) conformal deposition of a masking material on a patterned structure with nominally vertical sidewalls, (2) anisotropic etching of the mask material to remove horizontal portions of the conformal layer, and (3) removal of the patterned sidewall structure. This technique produces mask features which can be substantially smaller than the smallest dimension possible in the patterned structure.

Figure 7:
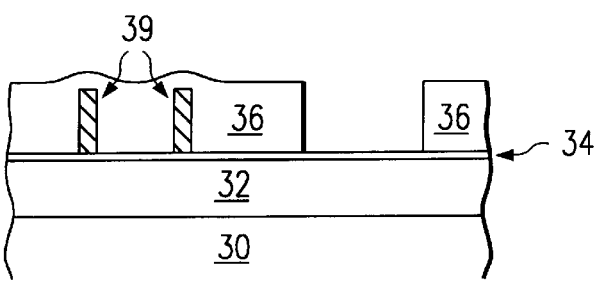
FIG. 7 shows the structure of FIG. 6 after another patterned E-beam layer has been formed on the surface.

If the desired structure requires more than two closely spaced epitaxy mask structures, the process given above is repeated. As shown in FIG. 7, another layer of E-beam resist is deposited, exposed and developed producing another patterned E-beam resist layer 36.

Figure 8:
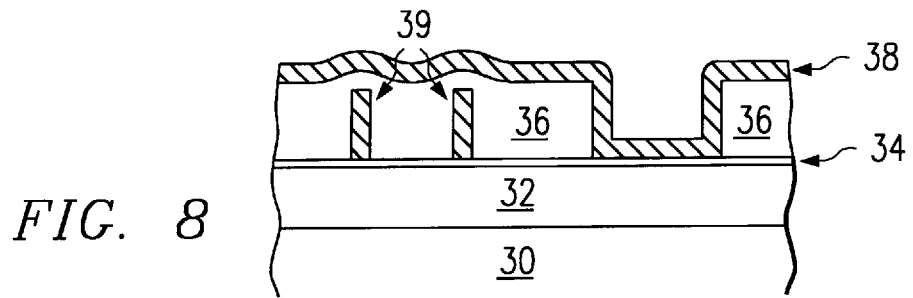
FIG. 8 shows the structure of FIG. 7 after another thin glass layer has been deposited.
Figure 9:
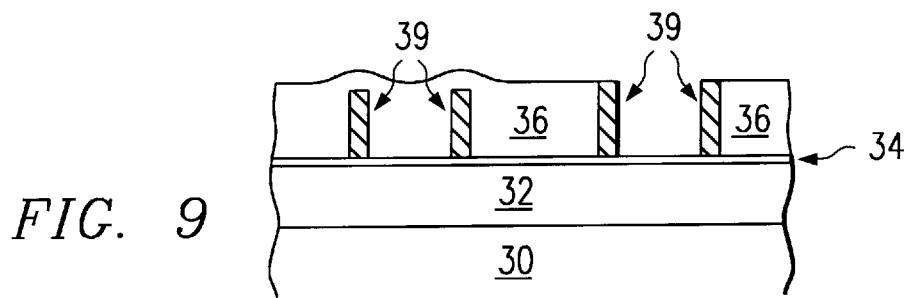
FIG. 9 shows the structure of FIG. 8 after an anisotropic etch of the second glass layer.
Figure 10:
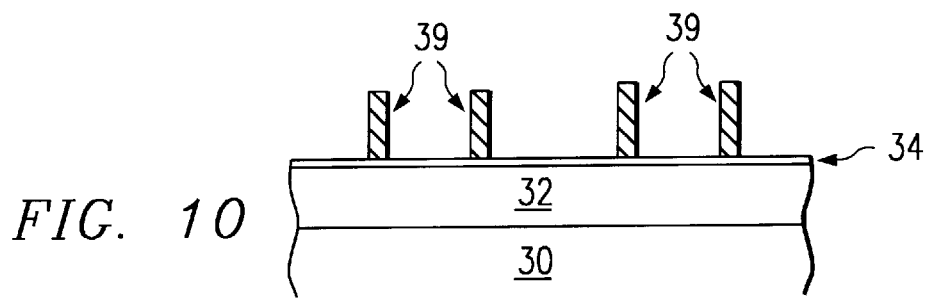
FIG. 10 shows the structure of FIG. 9 after removal of the second patterned E-beam resist layer, leaving an epitaxial mask.

Another layer of glass 38, again preferably 5 nm thick SiO$_2$, is deposited as shown in FIG. 8. Again, the glass 38 is subjected to an anisotropic reactive ion etch to remove horizontal portions and the remaining E-beam resist 36 is stripped, leaving additional epitaxy mask structures 39 as shown in FIG. 10.

Figure 11:
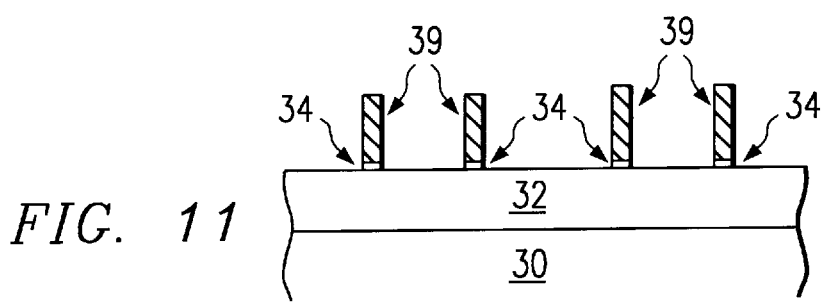
FIG. 11 shows the structure of FIG. 10 after desorption of the desorption layer.

A desorption step is performed in order to evaporate exposed areas of the InGaAs desorption layer 34. Elevated temperature causes the desorption layer 34, except for areas which are under the epitaxy mask 39, as shown in FIG. 11. The desorption temperature of InGaAs is known in the art.

Figure 12:
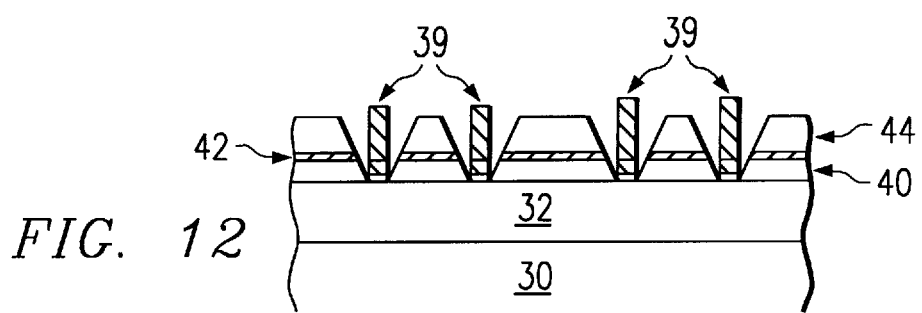
FIG. 12 shows the structure of FIG. 11 after the epitaxial deposition of a lower barrier layer, a quantum layer and an upper barrier layer.

After desorption, three layers are deposited by selective epitaxy onto the lower buffer layer 32 (the desorption layer 34 has been removed). Preferably, any well known MOCVD method is used. First, a lower barrier layer 40 is deposited. The lower barrier layer 40 is preferably 5 nm thick InP. The epitaxy masks 39 segment the growth of the lower barrier layer 40, as shown in FIG. 12. The lower barrier layer 40 generally will not have vertical sidewalls due to the crystal structure of the epitaxial layer. The barrier layer 40, and the subsequently grown epitaxial layers, will exhibit sidewalls which are at an angle of 54° from the horizontal.

Next, a quantum layer 42 is epitaxially deposited on the lower barrier layer 40. Preferably, quantum layer 42 is 5 nm thick lattice matched InGaAs. Quantum layer 42 will serve as the channel of the device. The nature of the crystal structure allows growth of the InGaAs quantum layer 42 on the horizontal surfaces, which are orientation <100>, but generally not on the sidewalls, which are orientation <111>. This behavior is referred to as 'facet selective growth'.

A third epitaxial layer is then grown. The upper barrier layer 44 is epitaxially deposited on quantum layer 44, and is preferably 10 nm thick lattice matched InP. The upper barrier layer 44 is preferably modulation-doped to produce a 'plane' of n-type dopants. Preferably, the dopant is silicon at a concentration of 1×10$^{18}$ cm$^{-3}$, and the 'plane' of dopants is nominally 5 nm from the interface with quantum layer 42. These dopants, due to the electronic band structure of the interface, will diffuse into the quantum layer 42 and form a conductive channel there.

The term selective epitaxy, as used herein, means the formation of one or more epitaxial layers which have lateral structure without the use of an etch. Selective epitaxy can be caused by facet selective growth, as described above, or by the tendency of deposited species to avoid the oxide structures which form the epitaxy mask 39. As can be seen from the Figures, epitaxy in the presence of the epitaxy mask 39 leads to laterally segmented epitaxial layers without etching.

After selective epitaxy, the epitaxy masks 39 are removed by wet etching. Many suitable wet etches are known in the art. Portions of the desorption layer which were under the epitaxy mask will remain. In the preferred embodiment, these areas are only 2 nm high and will not interfere with subsequent fabrication steps or the operation of the device. The wafer is cleaned, preferably by an in situ electron cyclotron resonant atomic hydrogen plasma.

Figure 13:
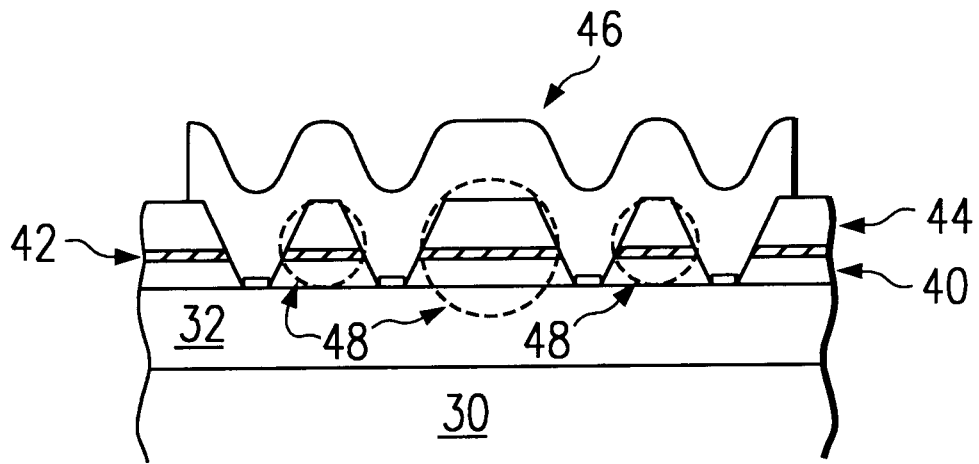
FIG. 13 shows the structure of FIG. 12 after the removal of the epitaxial mask and the formation of a lateral barrier structure.

Following cleaning, the lateral barrier structure 46 is formed, preferably by regrowing indium phosphide on the surface to a thickness of from 10 to 100 nm. Methods of regrowing InP are known in the art. As FIG. 13 illustrates, the lateral barrier structure 46 fills the gaps left by the epitaxy masks, thereby forming tunneling barriers which separate the quantum wells 48. The lateral barrier structure 48 is then patterned to expose the upper barrier layer 44 on either side of the device. The resulting structure is illustrated in FIG. 13.

Figure 14:
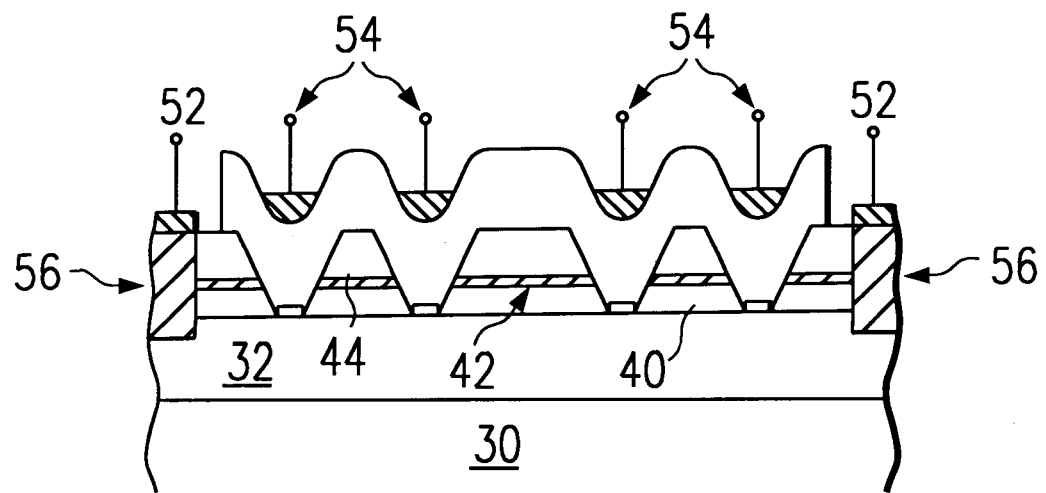
FIG. 14 shows the structure of FIG. 13 after the formation of source, drain and gate contacts.

Source and drain ohmic contacts to the channel (quantum layer 42) are formed. A metal alloy or mixture, preferably Au/Ge/Ni, is deposited on the upper barrier layer 44 and then diffused into the device by rapid thermal annealing to form source and drain ohmic contacts 56, as illustrated in FIG. 14. Areas of undiffused alloy remaining on the surface constitute source contact 50 and drain contact 52.

Gate contacts 54 are deposited on the lateral barrier structure 46. Contacts 54 may be over the quantum wells 48 or, as in the preferred embodiment, may be deposited over the tunneling barriers as is shown in FIG. 14. Preferably, contacts 54 are Cr/Au, although Ti/Pt/Au may also be used.

The relationships between the width of the quantum wells 48 and the lateral separation of quantum wells (i.e. the width of the tunneling barriers) are easily understood given the 54° sidewalls and the desired thicknesses of the layers which are formed by selective epitaxy. Further, the requirements on the E-beam pattern are easily understood given the sidewall glass thickness and the fact that the center of a tunneling barrier corresponds to the center of a glass 'spike' 39, as is illustrated in the Figures.

The preferred embodiment of the invention is equally suited for the fabrication of either coupled quantum dot devices or coupled quantum wire devices. Generally, the size of the quantum layer 42 in the dimension normal to the page, as illustrated in the Figures, determines whether the quantum wells are quantum dots or quantum wires. Quantum dots are generally spatially confined in that dimension (i.e. the extent of the quantum well in the mal to the page is on the order of the electron Bloch wavelength), whereas generally are not.

The sole Table, below, provides an overview of the preferred embodiment and the Figures.

TABLE

| Figure Element | Generic Term | Preferred or Specific Term | Function / Alternate Terms |
|---|---|---|---|
| 30 | substrate | indium phosphide (InP) (100) ORIENTATION | |
| 32 | lower buffer layer | 30 nm InAlAs | serves to contine electrons within the quantum layer 42; InP |

TABLE-continued

| Figure Element | Generic Term | Preferred or Specific Term | Function / Alternate Terms |
| --- | --- | --- | --- |
| 34 | desorption layer | 2 nm InGaAs | prevents oxidation of lower buffer layer 32 |
| 36 | E-beam resist | polymethylmethacrylate (PMMA) | preferably exhibits vertical sidewalls |
| 38 | glass layer | 5 nm $SiO_2$ | $Si_3N_4$; conformally deposited |
| 39 | epitaxy mask | 5 nm wide 'spikes' of $SiO_2$ | remnants of glass after etch; allows selective epitaxy of layers 40–44 |
| 40 | lower barrier layer | 5 nm InP | |
| 42 | quantum layer | 5 nm InGaAs | |
| 44 | upper barrier layer | 10 nm InP modulation-doped with silicon at $1 \times 10^{18}$ cm$^{-3}$ | |
| 46 | Lateral barrier stucture | 10–100 nm InP | forms tunneling barriers between quantum wells |
| 48 | quantum well | | Exhibits discrete allowed electron energies; 'Quantum Well Structure' |
| 50 | source contact | Au/Ge/Ni | |
| 52 | drain contact | Au/Ge/Ni | |
| 54 | gate contact | CrAu | TIPtAu; Forms Schottky contact with lateral barrier structure, applied voltage controlled alignment or misalignment quantum states within adjacent quantum wells |
| 56 | source/drain ohmic contact | Diffused Au/Ge/Ni | |

A few preferred embodiments have been described in detail hereinabove. It is to be understood that the scope of the invention also comprehends embodiments different from those described, yet within the scope of the claims. For example, use of the invention is contemplated for the fabrication of discrete components or fully integrated circuits in either the materials of the preferred embodiment or in other electronic materials families. In addition, although no vertically overlaid, multilayered logic devices were described, the novel process presented is equally suited to three dimensional constructions.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a quantum well device, said method comprising:
    forming an epitaxy mask by sidewall defined masking; and
    forming one or more quantized regions by selective deposition of one or more epitaxial layers.

2. A method of fabricating a coupled quantum well device, said method comprising:
    forming an epitaxy mask on a crystalline substrate to form a masked substrate;
    selectively depositing one or more epitaxial layers on said masked substrate to form a laterally segmented quantum well structure; and
    epitaxially depositing a tunneling barrier on said segmented quantum well structure.

3. The method of claim 2, wherein said step of forming an epitaxy mask comprises:
    forming a patterned e-beam resist layer;
    conformally depositing a glass layer on said patterned e-beam resist;
    anisotropically etching said glass layer; and
    removing said e-beam resist layer.

4. A method of fabricating a coupled quantum well device, said method comprising:
    epitaxially depositing a lower buffer layer on a substrate;
    epitaxially depositing a desorption layer on said lower buffer layer;
    depositing an e-beam resist layer on said desorption layer;
    exposing said e-beam resist layer to an electron beam;
    developing said e-beam layer to form a patterned e-beam resist with sidewalls;
    conformally depositing a glass layer on said patterned e-beam resist;
    anisotropically etching said glass layer to remove said glass except at said sidewalls to form an epitaxy mask;
    removing said patterned e-beam resist;
    heating said substrate to evaporate said desorption layer;
    epitaxially depositing a lower barrier layer;
    epitaxially depositing a quantum layer;
    epitaxially depositing an upper barrier layer;
    removing said epitaxy mask to form a laterally segmented quantum well structure;
    forming a lateral barrier structure on said quantum well structure;
    forming ohmic contacts to said quantum layer; and
    forming Schottky contacts to said lateral barrier structure.

5. The method according to claim 4, wherein:
said substrate comprises InP;
said lower buffer layer comprises InAlAs;
said desorption layer comprises InGaAs;
said e-beam resist comprises polymethylmethacrylate;
said glass layer comprises SiO$_2$;
said anisotropic etch comprises a reactive ion etch
said lower barrier layer comprises InP;
said quantum layer comprises InGaAs;
said upper barrier layer comprises InP; and said lateral barrier structure comprises InP.

* * * * *